(12) United States Patent
Iwamoto et al.

(10) Patent No.: US 9,883,574 B2
(45) Date of Patent: Jan. 30, 2018

(54) TARGET PRODUCING APPARATUS

(71) Applicant: GIGAPHOTON INC., Tochigi (JP)

(72) Inventors: Fumio Iwamoto, Oyama (JP); Takashi Saito, Oyama (JP); Tsukasa Hori, Oyama (JP); Osamu Wakabayashi, Oyama (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 15/161,628

(22) Filed: May 23, 2016

(65) Prior Publication Data

US 2016/0270199 A1 Sep. 15, 2016

Related U.S. Application Data

(63) Continuation of application No. PCT/JP2014/084337, filed on Dec. 25, 2014.

(30) Foreign Application Priority Data

Dec. 26, 2013 (WO) .................. PCT/JP2013/084933

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/005* (2013.01)

(58) Field of Classification Search
CPC ..... H05G 2/005; H05G 2/006; G03F 7/70033
USPC ............................... 250/493.1, 503.1, 504 R
See application file for complete search history.

(56) References Cited

U.S. PATENT DOCUMENTS

| 2003/0223546 A1 | 12/2003 | McGregor et al. |
| 2006/0043319 A1 | 3/2006 | Gaebel et al. |
| 2008/0067456 A1 | 3/2008 | Kloepfel et al. |
| 2009/0230326 A1 | 9/2009 | Vaschenko et al. |

(Continued)

FOREIGN PATENT DOCUMENTS

| EP | 2 211 594 A2 | 7/2010 |
| JP | 2004-006365 A | 1/2004 |

(Continued)

OTHER PUBLICATIONS

International Search Report; PCT/JP2014/084337 dated Mar. 24, 2015.
Written Opinion; PCT/JP2014/084337 dated Mar. 24, 2015.

*Primary Examiner* — Wyatt Stoffa
*Assistant Examiner* — Hanway Chang
(74) *Attorney, Agent, or Firm* — Studebaker & Brackett PC

(57) ABSTRACT

An aspect of the present disclosure may include a gas lock cover secured to a nozzle holder and provided downstream of a nozzle. The gas lock cover may cover a periphery of an exit of the nozzle and be structured to guide gas supplied from a gas supply unit. The gas lock cover may include a hollow cylindrical part provided downstream of the nozzle and having an exit opening for outputting droplets that are outputted from the nozzle and pass through an internal cavity of the cylindrical part. The gas lock cover may include a channel for transmitting the gas supplied from the gas supply unit, the channel being structured to orient a flow of the transmitted gas so as to flow to the exit opening of the cylindrical part through the internal cavity of the cylindrical part.

3 Claims, 10 Drawing Sheets

(56) References Cited

U.S. PATENT DOCUMENTS

| | | | |
|---|---|---|---|
| 2010/0213395 A1* | 8/2010 | Ueno | ............ H05G 2/008 250/504 R |
| 2012/0280149 A1 | 11/2012 | Mestrom et al. | |
| 2015/0029478 A1 | 1/2015 | Schimmel et al. | |

FOREIGN PATENT DOCUMENTS

| | | |
|---|---|---|
| JP | 2006-086119 A | 3/2006 |
| JP | 2007-288190 A | 11/2007 |
| JP | 2008-027623 A | 2/2008 |
| JP | 2010-170772 A | 8/2010 |
| JP | 4773690 B2 | 9/2011 |
| JP | 2012-256608 A | 12/2012 |
| WO | 2013/124101 A2 | 8/2013 |

* cited by examiner

COMPARATIVE EXAMPLE

TARGET PRODUCING APPARATUS

CROSS-REFERENCE TO RELATED APPLICATIONS

The present application is a continuation application of International Application No. PCT/JP2014/084337 filed on Dec. 25, 2014, which claims priority from International Application No. PCT/JP2013/084933 filed on Dec. 26, 2013, the content of which is hereby incorporated by reference into this application.

BACKGROUND

1. Technical Field

The present disclosure relates to a target producing apparatus to be used in an extreme ultraviolet light generation apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm, and further, microfabrication with feature sizes of 32 nm or less will be required. In order to meet the demand for microfabrication with feature sizes of 32 nm or less, for example, an exposure apparatus is needed in which a system for generating extreme ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

An example of the present disclosure may be a target producing apparatus to be used in an extreme ultraviolet light generation apparatus capable of generating extreme ultraviolet light by irradiating droplets in a plasma generation region with a laser beam. The target producing apparatus may include: a tank capable of containing a droplet material; a heater capable of heating the tank to melt the droplet material; a nozzle provided at a distal end of the tank and being capable of outputting droplets toward the plasma generation region; a nozzle holder holding the nozzle on the tank; a gas supply unit capable of supplying a gas; and a gas lock cover secured to the nozzle holder and provided downstream of the nozzle. The gas lock cover may cover a periphery of an exit of the nozzle and be structured to guide the gas supplied from the gas supply unit. The gas lock cover may include: a hollow cylindrical part provided downstream of the nozzle and having an exit opening for outputting droplets that are outputted from the nozzle and pass through an internal cavity of the cylindrical part; and a channel for transmitting the gas supplied from the gas supply unit. The channel may be structured to orient a flow of the transmitted gas so as to flow to the exit opening of the cylindrical part through the internal cavity of the cylindrical part.

Another example of the present disclosure may be a target producing apparatus to be used in an extreme ultraviolet light generation apparatus capable of generating extreme ultraviolet light by irradiating droplets in a plasma generation region with a laser beam. The target producing apparatus may include: a tank capable of containing a melted droplet material; a nozzle provided at a distal end of the tank and being capable of outputting droplets toward the plasma generation region; a nozzle holder holding the nozzle on the tank; a gas supply unit capable of supplying a gas; a gas lock cover secured to the nozzle holder and provided downstream of the nozzle. The gas lock cover may be structured to guide the gas supplied from the gas supply unit. The gas lock cover may include: a hollow cylindrical part provided downstream of the nozzle and having an exit opening for outputting droplets that are outputted from the nozzle and pass through an internal cavity of the cylindrical part; and a channel for transmitting the gas supplied from the gas supply unit. The channel may be structured to orient a flow of the transmitted gas so as to flow to the exit opening of the cylindrical part through the internal cavity of the cylindrical part. The channel may include a buffer space that joins the internal cavity of the cylindrical part and is structured to diffuse the gas flow entering the buffer space into different directions to guide the gas into the internal cavity of the cylindrical part.

BRIEF DESCRIPTION OF THE DRAWINGS

Hereinafter, selected embodiments of the present disclosure will be described with reference to the accompanying drawings.

DETAILED DESCRIPTION

Figure 1:
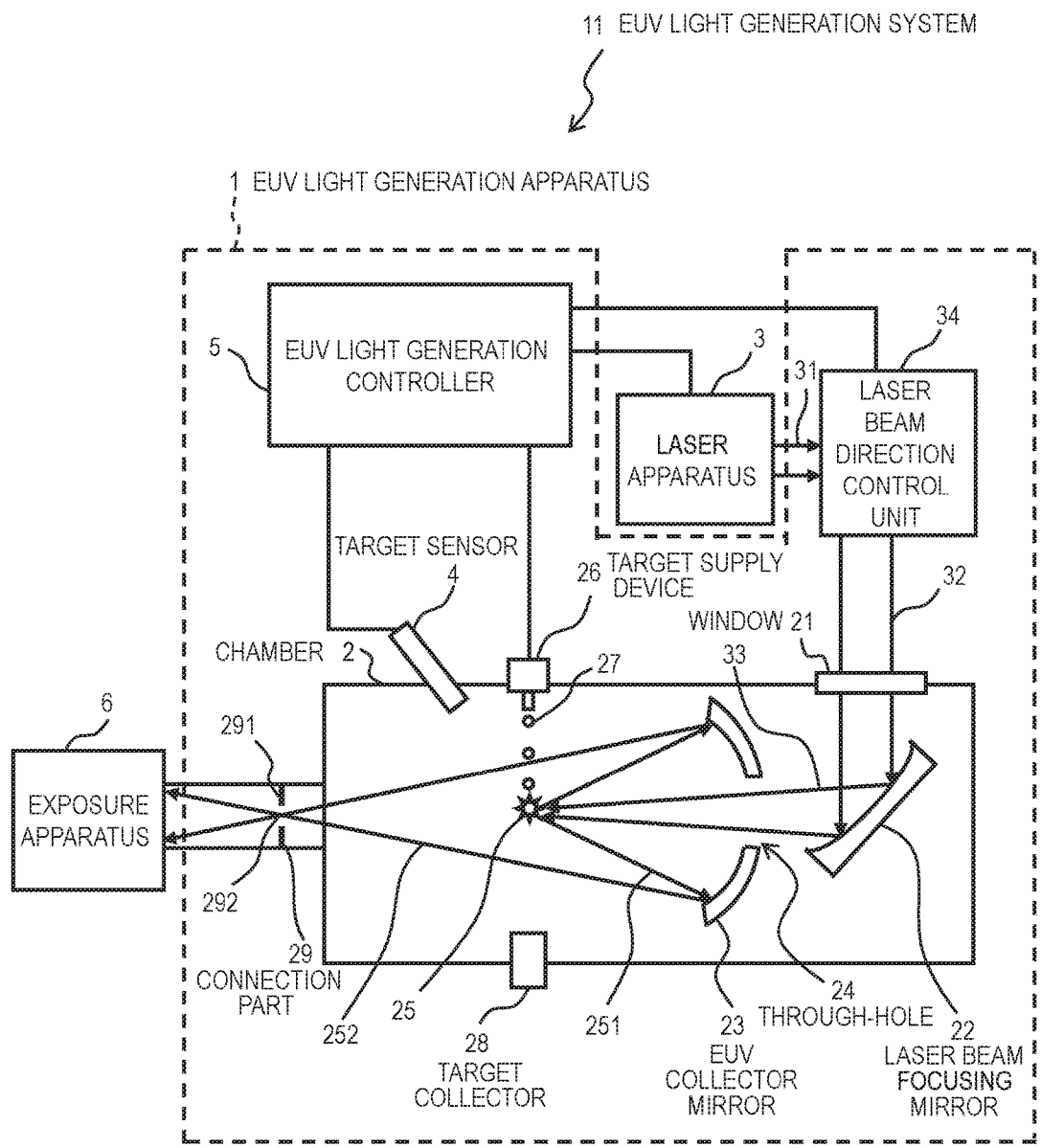
FIG. 1 schematically illustrates an exemplary configuration of an LPP type EUV light generation system.

<Contents>
1. Overview
2. Terms
3. Overview of EUV Light Generation System
   3.1 Configuration
   3.2 Operation
4. EUV Light Generation System Including Target Producing Apparatus
   4.1 Configuration
   4.2 Operation
   4.3 Comparative Example of Configuration of Tip of Droplet Supply Device
   4.4 Issues
5. Embodiments
   5.1 Embodiment 1: Target Producing Apparatus Including Gas Lock Device Configuration
   5.2 Embodiment 2: Gas Lock Device with Buffer Space (1)
   5.3 Embodiment 3: Gas Lock Device with Buffer Space (2)
   5.4 Embodiment 4: Gas Lock Device with Buffer Space (3)
   5.5 Embodiment 5: Gas Lock Device with Buffer Space (4) (with Damper Member)
   5.6 Embodiment 6: Gas Lock Device with Buffer Space (5) (with Tilted Damper Member)

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. Overview

In an LPP type EUV light generation system, a target producing apparatus may output droplets of a target material from a nozzle into a chamber. The target producing apparatus may be controlled so that the droplets will reach a plasma generation region in the chamber at desired intervals.

The LPP type EUV light generation system may generate EUV light by irradiating targets with a pulse laser beam to change the targets into plasma. The LPP type EUV light generation system for an exposure apparatus may generate laser beam pulses at a high cyclic frequency of 50 to 100 kHz or higher to irradiate targets.

The targets, typically made of tin, irradiated with a pulse laser beam may diffuse because of the shock caused by the inflation pressure of the plasma when the targets change into plasma to generate EUV light. The targets not irradiated with the pulse laser beam may diffuse in being collected into a target collector. The diffuse target material (also referred to as droplet material) may become fine contaminant or debris and spread within the chamber. The spreading debris may reach the nozzle bore of the target supply device.

In an aspect of the present disclosure, the target producing apparatus may include a gas lock cover that covers the periphery of the nozzle exit and directs the gas supplied from a gas supply unit to keep the debris away from the nozzle exit with the gas flow. The gas lock cover may include a cylindrical part and a channel. The cylindrical part may be disposed downstream of the nozzle, be hollow, and have an exit opening. The droplets outputted from the nozzle may pass through the internal cavity of the cylindrical part and go out from the exit opening. The gas supplied from the gas supply unit may pass through the channel. The channel may orient the flow of the gas that is transmitted through the channel to go through the internal cavity of the cylindrical part to the exit opening of the cylindrical part.

This aspect of the present disclosure may prevent the debris from adhering to the nozzle using the gas flow. The debris may cause fluctuations in the trajectories of droplets.

In another aspect of the present disclosure, the target producing apparatus may include a gas lock cover disposed downstream of the nozzle. The gas lock cover may direct the gas supplied from the gas supply unit to keep the debris away from the nozzle exit. The gas lock cover may include a cylindrical part and a channel. The cylindrical part may be disposed downstream of the nozzle, be hollow, and have an exit opening. The droplets outputted from the nozzle may pass through the internal cavity of the cylindrical part and go out from the exit opening. The gas supplied from the gas supply unit may pass through the channel. The channel may orient the flow of the gas that has passed through the channel to go through the internal cavity of the cylindrical part to the exit opening of the cylindrical part. The channel may include a buffer space joined to the internal cavity of the cylindrical part to diffuse the gas flow that has entered the buffer space in different directions in directing the gas flow into the internal cavity of the cylindrical part.

This other aspect of the present disclosure may prevent the debris to cause fluctuations in the trajectories of droplets from adhering to the nozzle using a gas flow and further, prevent fluctuations in the trajectories of the droplets caused by the gas flow.

2. Terms

Terms used in the present disclosure will be described hereinafter. A "gas lock device" is a device to prevent debris from adhering to a specific region with a gas flow. A "nozzle bore" is a bore formed in a nozzle to output a droplet material therethrough. A "nozzle exit" is an opening at the distal end of the nozzle bore.

"Debris" is a substance including the target material supplied into the chamber but not changed to plasma as well as ionic and neutral particles emitted from plasma and may adhere to the nozzle to disturb precise supply of droplets. "Outputting a droplet from the nozzle or nozzle bore" includes an action that the droplet passes through the nozzle bore and in addition, an action that a droplet is produced and outputted from the jet outputted from the nozzle exit.

3. Overview of EUV Light Generation System

3.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 26.

The chamber 2 may be sealed airtight. The target supply device 26 may be mounted onto the chamber 2, for example, to penetrate a wall of the chamber 2. A target material to be supplied by the target supply device 26 may include, but is not limited to, tin, terbium, gadolinium, lithium, xenon, or any combination thereof.

The chamber 2 may have at least one through-hole formed in its wall, a window 21 may be installed in the through-hole, and the pulse laser beam 32 from the laser apparatus 3 may travel through the window 21. An EUV collector mirror 23 having a spheroidal surface may, for example, be provided in the chamber 2. The EUV collector mirror 23 may have a first focus and a second focus.

The EUV collector mirror 23 may have a multi-layered reflective film including alternately laminated molybdenum layers and silicon layers formed on the surface thereof. The EUV collector mirror 23 is preferably positioned such that the first focus lies in a plasma generation region 25 and the second focus lies in an intermediate focus (IF) region 292. The EUV collector mirror 23 may have a through-hole 24 formed at the center thereof and a pulse laser beam 33 may travel through the through-hole 24.

The EUV light generation apparatus 1 may include an EUV light generation controller 5 and a target sensor 4. The target sensor 4 may have an imaging function and detect at least one of the presence, trajectory, position, and speed of a target 27.

Further, the EUV light generation system 11 may include a connection part 29 for allowing the interior of the chamber 2 to be in communication with the interior of the exposure apparatus 6. A wall 291 having an aperture may be provided in the connection part 29. The wall 291 may be positioned such that the second focus of the EUV collector mirror 23 lies in the aperture.

The EUV light generation apparatus 1 may also include a laser beam direction control unit 34, a laser beam focusing mirror 22, and a target collector 28 for collecting targets 27. The laser beam direction control unit 34 may include an optical element for defining the direction and an actuator for adjusting the position, the orientation or posture, and the like of the optical element.

3.2 Operation

With reference to FIG. 1, a pulse laser beam 31 outputted from the laser apparatus 3 may pass through the laser beam direction control unit 34 and, as the pulse laser beam 32, travel through the window 21 and enter the chamber 2. The pulse laser beam 32 may travel inside the chamber 2 along at least one beam path, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam, the target 27 may be turned into plasma, and rays of light 251 may be emitted from the plasma.

The EUV light 252 included in the light 251 may be reflected selectively by the EUV collector mirror 23. EUV light 252 reflected by the EUV collector mirror 23 may be focused at the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control: the timing when the target 27 is outputted and the direction into which the target 27 is outputted, for example.

Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

Figure 2:
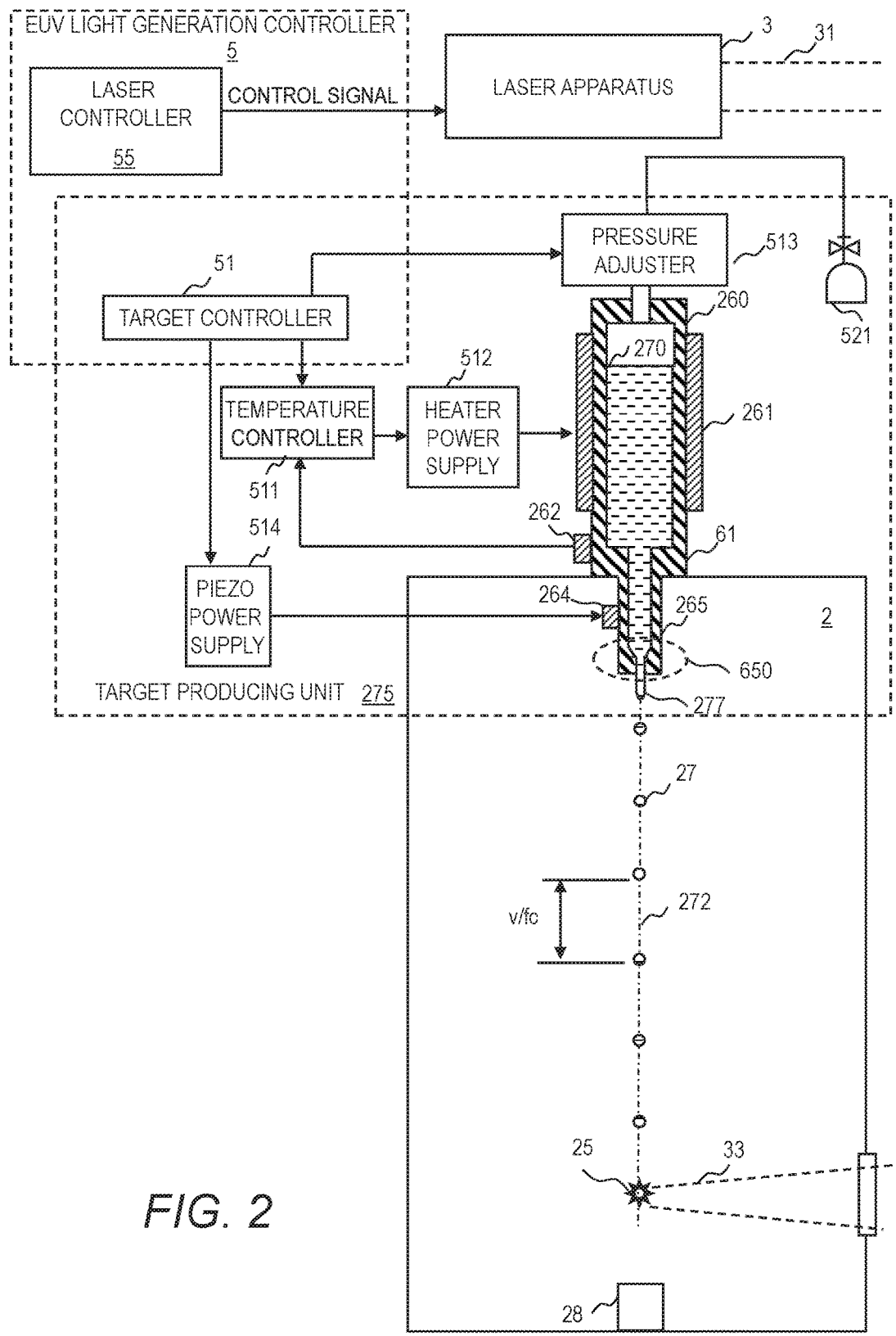
FIG. 2 schematically illustrates a configuration of a part of the EUV light generation system including a target producing apparatus.

4. EUV Light Generation System Including Target Producing Apparatus 4.1 Configuration FIG. 2 schematically illustrates a configuration of a part of the EUV light generation system 11 including a target producing apparatus 275. The EUV light generation controller 5 may include a target controller 51 and a laser controller 55. The target controller 51 may control the operation of the other components in the target producing apparatus 275. The laser controller 55 may control the operation of the laser apparatus 3.

The target producing apparatus 275 may include the target controller 51, a temperature controller 511, a heater power supply 512, a pressure adjuster 513, a piezo power supply 514, a droplet supply device 260, and an inert gas source 521.

The droplet supply device 260 may be mounted on the chamber 2. The droplet supply device 260 may include a tank 61, a heater 261, a temperature sensor 262, and a piezoelectric element 264. The tank 61 may have a smaller-diameter projection 265 at the distal end thereof.

A part of the tank 61 may be fit in a through-hole formed in a wall of the chamber 2 and the projection 265 of the tank 61 may be located inside the chamber 2. The projection 265 may have a nozzle bore to eject the melted droplet material 270. The material of droplets may be referred to as droplet material. The heater 261 and the temperature sensor 262 may be anchored on the outside of the tank 61. The piezoelectric element 264 may be anchored on the outside of the projection 265.

4.2 Operation

The droplet supply device 260 may store the droplet material 270 in the tank 61 in a melted state with the heater 261. The target material may be tin, for example. The target controller 51 may control the temperature of the heater 261 to change the tin in the tank 61 into a liquid state by controlling the heater power supply 512 with the temperature controller 511. As a result, the tin stored in the tank 61 may be melted.

The target controller 51 may control the piezo power supply 514 to send an electric signal to the piezoelectric element 264 at such a frequency to produce droplets from the liquid tin ejected from the projection 265.

The pressure adjuster 513 may adjust the pressure of the inert gas to be supplied from the inert gas source 521 to the tank 61. The target controller 51 may control the pressure in the tank 61 with the pressure adjuster 513. The pressure adjuster 513 may adjust the pressure in the tank 61 to a predetermined value so that the droplets 27 will reach the plasma generation region 25 at a predetermined speed in a designed trajectory 272 in accordance with instructions from the target controller 51.

The predetermined speed may be, for example, 60 m/s to 110 m/s. The predetermined pressure in the tank 61 may be, for example, 10 MPa to 20 MPa. As a result, a jet 277 of the droplet material may be ejected from the hole of the projection 265 at the predetermined speed.

The target controller 51 may send an electric signal at a carrier frequency fc to the piezo power supply 514 to oscillate the piezoelectric element 264 at the carrier frequency fc. The projection 265 may oscillate with the oscillation of the piezoelectric element 264 at the carrier frequency fc. The carrier frequency fc may be, for example, 1500 kHz.

The oscillation of the projection 265 at the carrier frequency fc may cause the jet 277 to oscillate at the carrier frequency fc. As a result, droplets 27 may be produced from the jet 277 at the carrier frequency fc.

The outputted droplets 27 may have diameters of 20 μm to 30 μm. The laser controller 55 may control the laser apparatus 3 to irradiate the plasma generation region 25 with a pulse laser beam 33 in synchronous with arrival of droplets 27 at the plasma generation region 25. As a result, the target droplets 27 may turn into plasma to generate EUV light.

The droplets 27 not irradiated with the pulse laser beam 33 may pass through the plasma generation region 25 and enter the target collector 28 to be stored in the state of liquid tin.

4.3 Comparative Example of Configuration of Tip of Droplet Supply Device

Figure 3:
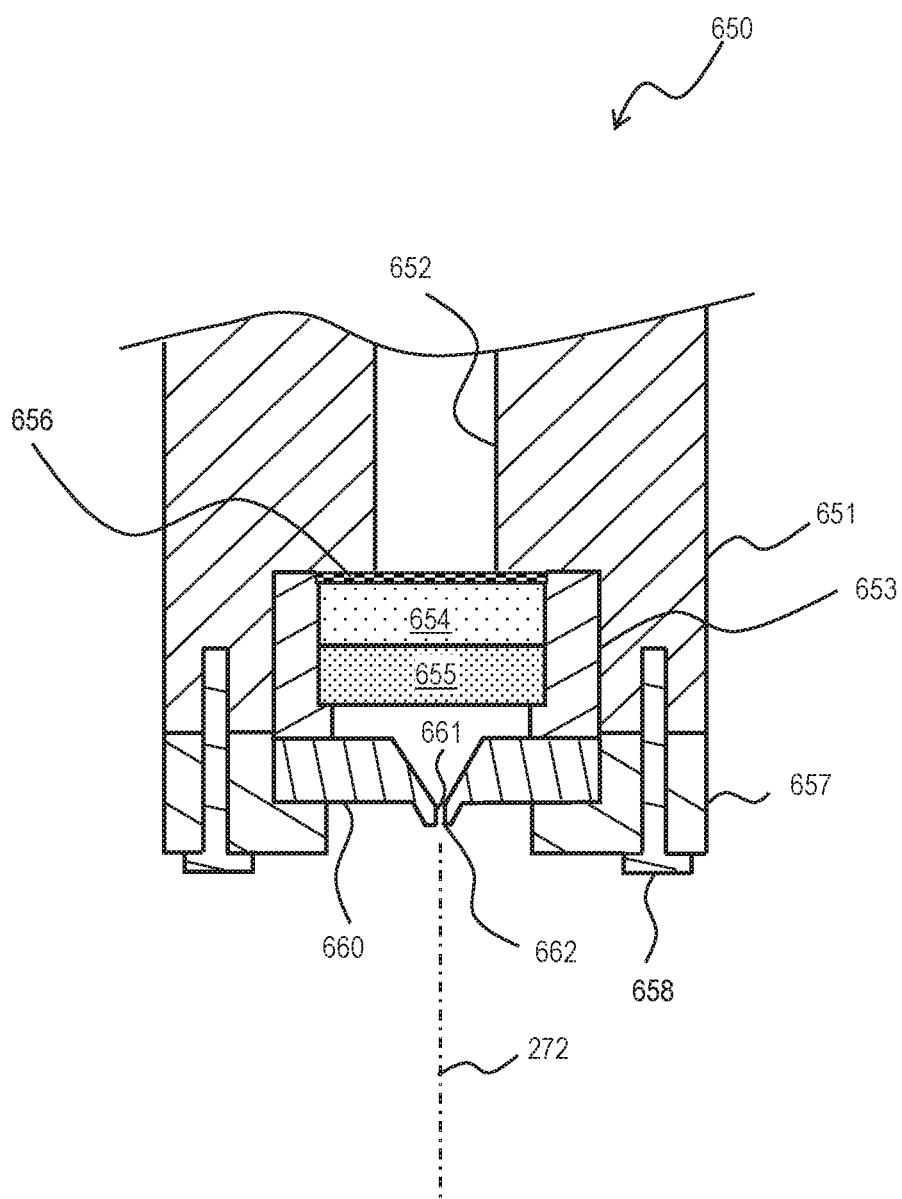
FIG. 3 illustrates a comparative example of the configuration of the tip of a projection of a tank.

FIG. 3 illustrates a comparative example of the configuration of the tip 650 of the projection 265 of the tank 61 in FIG. 2. The tip 650 may include an output tube 651 of the tank 61 and a nozzle 660 held at the distal end of the output tube 651. The output tube 651 may have a channel 652 in which the pressurized droplet material 270 flows. The inner diameter of the channel 652 may be smaller than the inner diameter of the body of the tank 61 containing the droplet material 270.

Stacked filters 654 and 655 may be provided upstream of the nozzle 660. A filter holder 653 holding the filters 654 and 655 may be fitted in the output tube 651. A shim 656 may be provided upstream of the filters 654 and 655 to adjust the pressure to the filters 654 and 655.

The filters 654 and 655 may remove impurities in the droplet material 270 flowing in the channel 652. The filters 654 and 655 may have different densities. The number of filters may depend on the design. The filters may be omitted.

A nozzle holder 657 may hold the nozzle 660 and fix the nozzle 660 to the output tube 651. The nozzle holder 657 may be secured to the output tube 651 with one or more bolts 658.

The nozzle 660 may have a nozzle bore 661 to output the droplet material 270. The nozzle bore 661 may have an exit opening (nozzle exit) 662 of the nozzle 660 at the distal end thereof. As described above, the jet 277 of the droplet material may be outputted from the nozzle exit 662.

4.4 Issues

When a droplet 27 irradiated with a pulse laser beam 33 changes to plasma to generate EUV light, the droplet 27 may diffuse because of the shock of the inflation pressure of the plasma. A droplet 27 not irradiated with the pulse laser beam 33 may diffuse when being collected into the target collector 28. The diffused droplet material may become fine contaminant or debris and spread within the chamber 2. The spreading debris may adhere to the nozzle bore 661 of the nozzle 660 and its periphery. The debris adhered to the nozzle 660 may disturb stable production of droplets.

5. Embodiments

Figure 4:
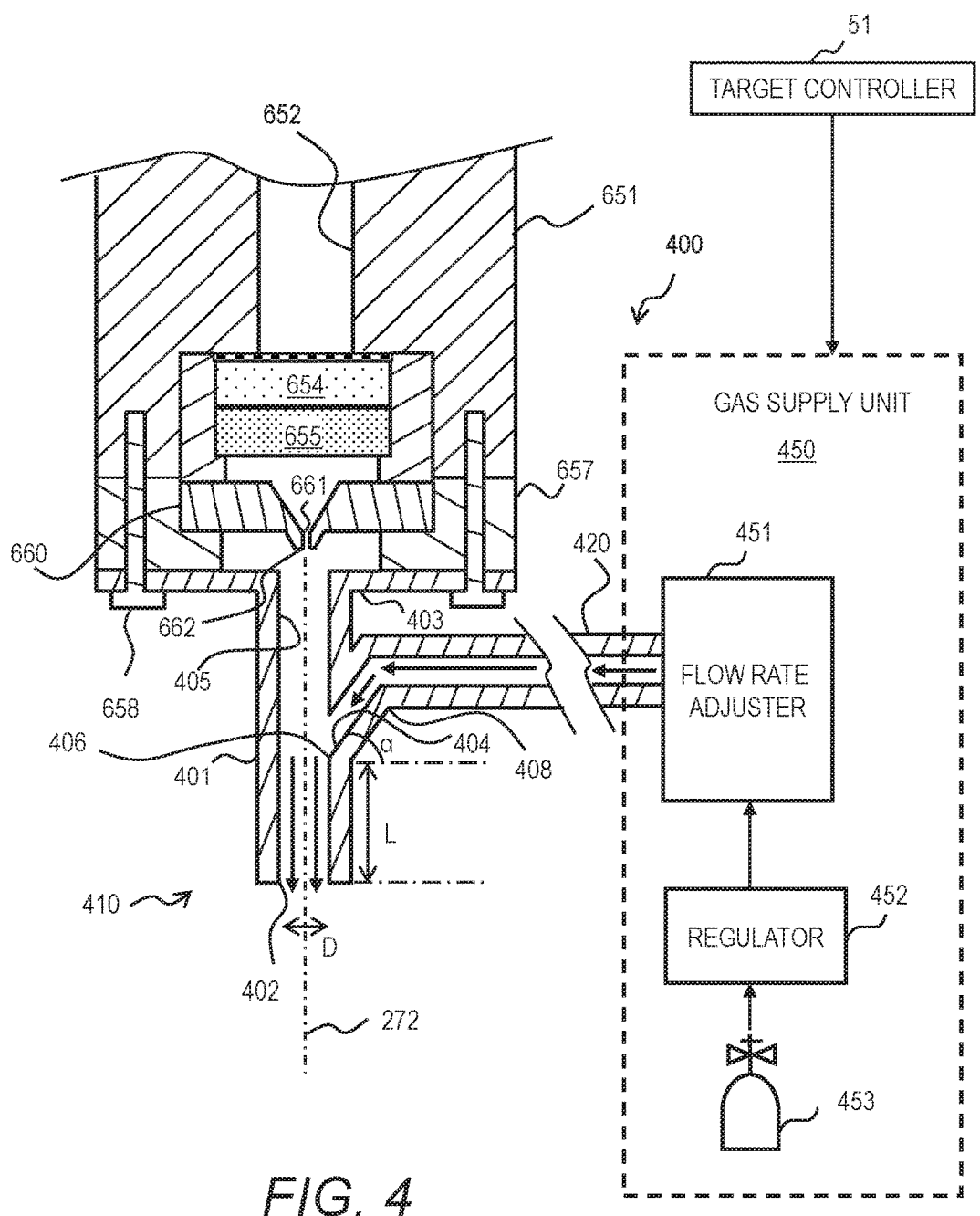
FIG. 4 schematically illustrates a configuration of a part of the target producing apparatus in Embodiment 1.

5.1 Embodiment 1: Target Producing Apparatus Including Gas Lock Device Configuration FIG. 4 schematically illustrates a configuration of a part of the target producing apparatus 275 in the present embodiment. The target producing apparatus 275 may include a gas lock device 400 for preventing debris from adhering to the nozzle bore 661 and the periphery of the nozzle exit 662 of the nozzle 660. The gas lock device 400 may prevent debris from adhering to the nozzle bore 661 and the periphery of the nozzle exit 662 by keeping the debris away from the nozzle exit 662 with a gas flow.

The gas lock device 400 may be provided downstream of the nozzle 660 and include a gas lock cover 410 for covering the periphery of the nozzle exit 662 and a gas supply unit 450 for supplying lock gas to the gas lock cover 410. The gas supply unit 450 and the gas lock cover 410 may be connected by a relay tube 420.

The gas supply unit 450 may include a flow rate adjuster 451, a regulator 452, and a gas source 453. The flow rate adjuster 451 may adjust the flow rate of the lock gas supplied from the gas source 453 to the gas lock cover 410 through the relay tube 420. The regulator 452 may adjust the gas pressure of the gas supplied from gas source 453. The target controller 51 may control the flow rate adjuster 451 and the regulator 452 to control the flow rate and the pressure of the lock gas to be supplied to the gas lock cover 410.

The gas supply unit 450 may supply a lock gas, which may be an active gas that reacts to the droplet material to generate a substance that becomes a gas at room temperature. If the droplet material is Sn, the gas to be supplied may be a gas including $H_2$. Sn and $H_2$ react to generate $SnH_4$, which is gaseous at room temperature. Instead of the reactive gas, the gas supply unit 450 may supply an inert gas such as a noble gas.

The gas lock cover 410 may include parts of a cylinder 401, a support 403 for supporting the cylinder 401 at an upstream of the cylinder 401, and a channel 404 for directing the lock gas to the inside (cylinder internal cavity) 405 of the cylinder 401. The channel 404 may be defined in a tube 408. The tube 408 may connect with the gas supply unit 450 via the relay tube 420.

The gas lock cover 410 may be disposed downstream of the nozzle 660 and cover the periphery of the nozzle exit 662 to direct the lock gas so that the lock gas flow will keep the debris away from the nozzle exit 662.

The support 403 may be secured tight to the nozzle holder 657 with bolts 658. The support 403 may be planar and surround the entire circumference of the nozzle exit 662. An O-ring may be sandwiched between the support 403 and the nozzle holder 657 for sealing.

The cylinder 401 may be disposed and fixed downstream of the nozzle exit 662 and extend toward the plasma generation region 25. The designed droplet trajectory 272 may run through the cylinder internal cavity 405. The nozzle exit 662 may be on the extension of the central axis of the cylinder 401; the central axis of the cylinder 401 may correspond to the designed droplet trajectory 272. The cylinder 401 may have an exit opening (cylinder exit) 402 to output droplets. The portion including the nozzle exit 662 may be exposed to the interior of the chamber 2 only at the cylinder exit 402 of the gas lock cover 410.

The material of the cylinder 401 may be a substance that hardly reacts to the droplet material, for example, Mo. Alternatively, the surface of the cylinder 401 may be coated with a substance that hardly reacts to the droplet material.

The channel 404 may join the cylinder internal cavity 405 at the side of the cylinder 401. A lock gas entrance 406 is formed in the side wall of the cylinder internal cavity 405 and the channel 404 may be connected with the cylinder internal cavity 405 at the lock gas entrance 406. The entry angle α of the channel 404 to the designed droplet trajectory 272 at the lock gas entrance 406 may be larger than 0°.

The entry angle α may be 45° or more and more particularly, 60° or more. The entry angle α may be defined between the central axis of the channel 404 and the designed droplet trajectory 272 at the lock gas entrance 406.

The lock gas supplied from the gas supply unit 450 may pass through the channel 404. The channel 404 may orient the flow of the lock gas so that the lock gas that has passed through the channel 404 will flow from the cylinder internal cavity 405 to the cylinder exit 402.

The cross-section of the cylinder internal cavity 405 is not limited to a circle, but may be a polygon. The inner wall of the cylinder 401 may have a smooth surface. This structure may prevent fluctuation of the droplet trajectory caused by turbulence of the lock gas flow.

The inner diameter D of the cylinder 401 and the length L from the lock gas entrance 406 to the cylinder exit 402 may be designed to achieve the gas lock function required to prevent adhesion of debris to the nozzle 660 and to reduce the flow rate of the lock gas. In addition, the inner diameter D of the cylinder 401 and the length L from the lock gas entrance 406 to the cylinder exit 402 may be designed to prevent droplets from adhering to the cylinder internal cavity 405 because of the fluctuation of the trajectory. For example, the inner diameter D may be determined to be 3 mm or more, and the length L may be determined to be 4 mm or more.

Operation

To start supplying targets, the target controller 51 may control the flow rate adjuster 451 to supply lock gas including $H_2$ to the cylinder internal cavity 405. The flow rate of the lock gas may be 42 sccm or more, for example.

The lock gas supplied from the gas supply unit 450 may pass through the relay tube 420 and the channel 404 of the gas lock cover 410 to enter the cylinder internal cavity 405. The lock gas that enters the cylinder internal cavity 405 from the channel 404 via the lock gas entrance 406 may flow to the cylinder exit 402. In this way, the gas lock cover 410 may generate a lock gas flow directed from the cylinder exit 402 toward the plasma generation region 25.

The droplets outputted from the nozzle 660 may pass through the cylinder internal cavity 405 and be outputted from cylinder exit 402 toward the plasma generation region 25. The angle of the gas flow entering the cylinder internal cavity 405 may depend on the angle of the channel 404 at the lock gas entrance 406. The entry angle of the lock gas flow entering the cylinder internal cavity 405 with respect to the trajectory of the droplets may be larger than 0°, and particularly, 45° or more, and further, 60° or more. This structure may reduce the effects of the lock gas flow on the droplet trajectory.

If debris scatters within the chamber 2, the lock gas flow passing through the cylinder internal cavity 405 and outputted from the cylinder exit 402 may reduce the momentum of the debris flying toward the nozzle 660. If the droplet material is Sn, part of the debris exposed to the lock gas flow may react to $H_2$ to become $SnH_4$ gas.

Effects

The gas lock device 400 may reduce the contaminant adhered to the nozzle 660, so that the nozzle 660 may stably output the droplet material for a long term. As a result, the EUV light generation system 11 may stably generate EUV light.

Structure of Cylinder

The structure of the cylinder 401 is described. The Peclet number of the cylinder 401 is expressed as the following formula (1). With increase in Peclet number, the effect of the gas lock function may increase.

$$Pe = vL/D_f \qquad (1)$$

Pe: Peclet number
v: Speed of lock gas flow inside the cylinder (m/s)
Df: Diffusion factor of debris in the lock gas (m²/s)
L: Length from the cylinder exit to the lock gas entrance (m)

If the cylinder has a right circular cylindrical shape, the Peclet number may be expressed as the following formula (2):

$$Pe = \left(\frac{Q}{P}\frac{4}{\pi D^2}\right) L/D_f \qquad (2)$$

Q: Flow rate of lock gas that passes through the cylinder internal cavity per pressure (Pa·m³/s)
P: Pressure in the cylinder internal cavity (Pa)
D: Inner diameter of the cylinder (m)

Substituting 4 mm for L, 3 mm for D, and 8 Pa·m²/s for the product P·Df of the pressure by the diffusion factor in the formula (2), if the minimum required Peclet number is 5, the required flow rate is 42 sscm or more. If the minimum required Peclet number is 10, the required flow rate is 85 sscm or more. If the minimum required Peclet number is 20, the required flow rate is 168 sscm or more.

The rate R of preventing contamination of debris is "the mass of debris in use of gas lock/the mass of debris not in use of gas lock" and may be expressed as the following formula (3).

$$R = EXP(Pe) \qquad (3)$$

Formula (3) teaches that increasing the Peclet number may prevent debris from reaching the nozzle 660 more effectively. Formula (2) may derive the following factors to increase the Peclet number:

(a) to increase the flow rate Q of the lock gas,
(b) to increase the length L from the lock gas entrance to the cylinder exit, and
(c) to reduce the inner diameter D of the cylinder.

However, the length of the cylinder 401 may have a limitation. For example, if the cylinder 401 is too long, the cylinder 401 may overlap with the optical path of the EUV light to block the EUV light. If the flow rate Q of the lock gas is increased or the inner diameter D of the cylinder 401 is reduced, the droplet trajectory may be largely fluctuated because of the effects of the lock gas flow.

Accordingly, a structure for reducing the fluctuation in droplet trajectory caused by the lock gas flow may be demanded. In the present embodiment, the entry angle α of the channel 404 to the designed droplet trajectory 272 may be larger than 0°, and particularly, 45° or more, and further, 60° or more. Such a structure may reduce the fluctuation in droplet trajectory caused by the lock gas flow.

5.2 Embodiment 2: Gas Lock Device with Buffer Space (1) Configuration

Figure 5A:
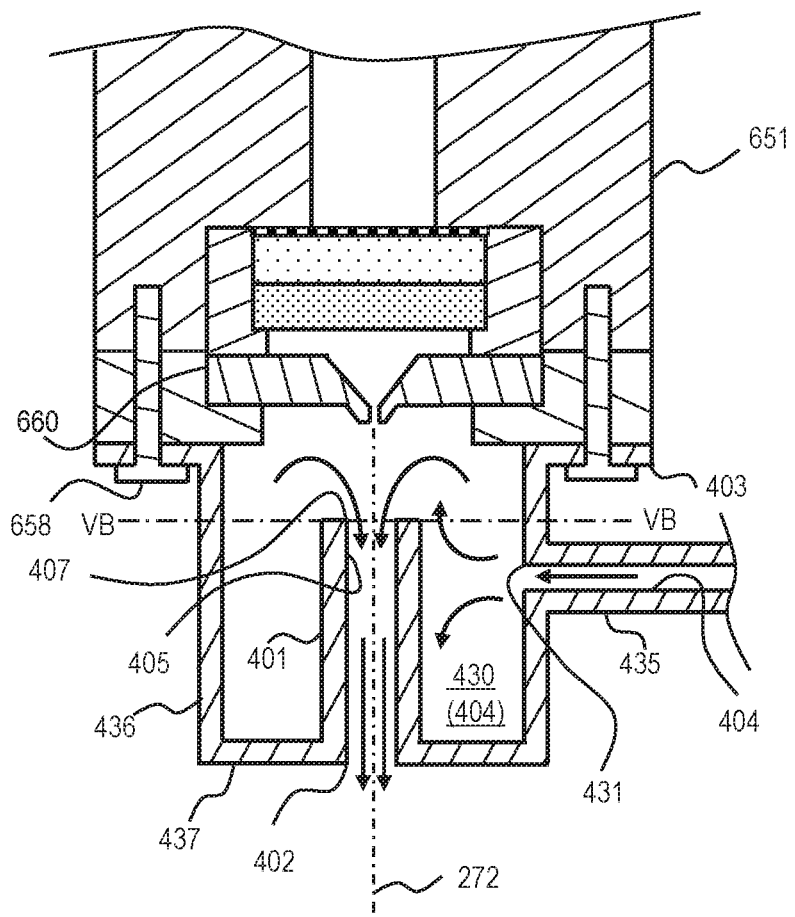
FIG. 5A schematically illustrates a configuration example of a gas lock cover in Embodiment 2.
Figure 5B:
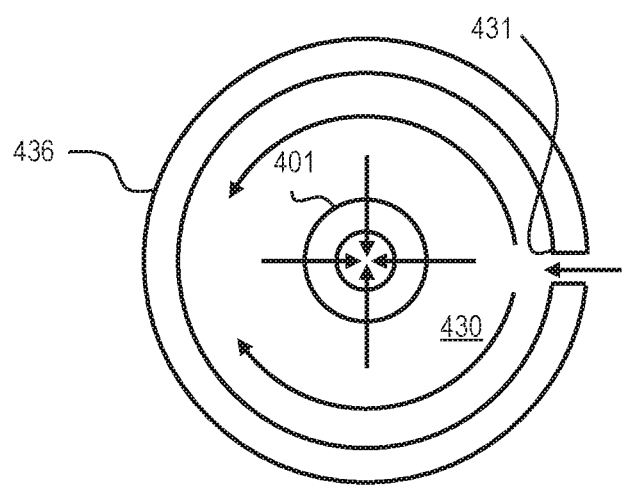
FIG. 5B schematically illustrates a configuration example of a gas lock cover in Embodiment 2.

The present embodiment provides a configuration example of a gas lock device 400 for reducing the fluctuation in droplet trajectory caused by the lock gas flow. FIGS. 5A and 5B schematically illustrate a configuration example of a gas lock cover 410 in the present embodiment. FIG. 5B shows a cross-section along the line VB-VB in FIG. 5A.

The gas lock cover 410 may have a buffer space 430 in the channel 404 for the lock gas. The buffer space 430 may be formed in the channel 404 between the tube 435 and the cylinder internal cavity 405. The buffer space 430 may be formed to surround the outer wall of the cylinder 401. In FIG. 5A, the channel 404 may include the space in the tube 435 and the buffer space 430.

The buffer space 430 may be configured as a space between the walls 436 and 437 surrounding the cylinder 401 and the cylinder 401. The wall 436 may be parallel to the outer wall of the cylinder 401. The wall 437 may connect the wall 436 and the cylinder exit 402. The wall 436 may be continued to the support 403.

The droplet entrance 407 of the cylinder 401 may be exposed to the buffer space 430. The buffer space 430 may join the cylinder internal cavity 405 via the droplet entrance 407.

The tube 435 may be connected at the lock gas entrance 431 formed in the wall 436. The lock gas entrance 431 to the buffer space 430 may face the outer wall of the cylinder 401. The lock gas entrance 431 may be located between the droplet entrance 407 and the nozzle exit 402 in the direction along the designed droplet trajectory 272.

Operation

The lock gas supplied from the gas supply unit 450 may flow through the channel 404 in the tube 435 and enter the buffer space 430 from the lock gas entrance 431. As illustrated in FIGS. 5A and 5B, the buffer space 430 may diffuse the incoming lock gas flow into different directions to guide the gas to the cylinder internal cavity 405. The lock gas that has entered the buffer space 430 may diffuse in the circumferential directions and the axial directions of the cylinder 401. The speed of the lock gas flow may decrease in the buffer space 430.

The lock gas flow diffused in the buffer space 430 may enter the cylinder internal cavity 405 through the droplet entrance 407 from various different directions. As illustrated in FIGS. 5A and 5B, the lock gas may enter the cylinder internal cavity 405 from any directions of the droplet entrance 407.

Effects

The buffer space 430 may prevent the lock gas coming from the tube 435 from directly blowing the droplets. Since the buffer space 430 may diffuse the incoming gas flow into different directions to guide the gas into the cylinder internal cavity 405, the lock gas may enter the cylinder internal cavity 405 from many different directions. The speed of the lock gas flow in each direction may decrease. Furthermore, the lock gas may enter the cylinder internal cavity 405 from the opposite direction. As a result, fluctuation in droplet trajectory may be prevented.

5.3 Embodiment 3: Gas Lock Device with Buffer Space (2) Configuration

Figure 6A:
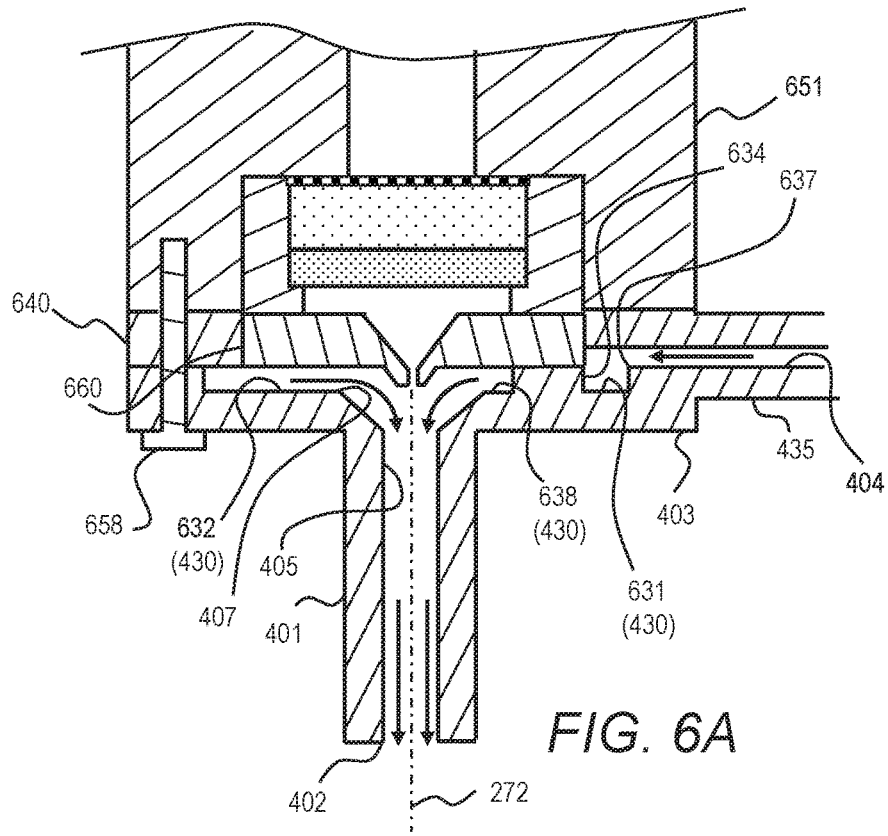
FIG. 6A schematically illustrates a configuration example of a gas lock cover in Embodiment 3.
Figure 6B:
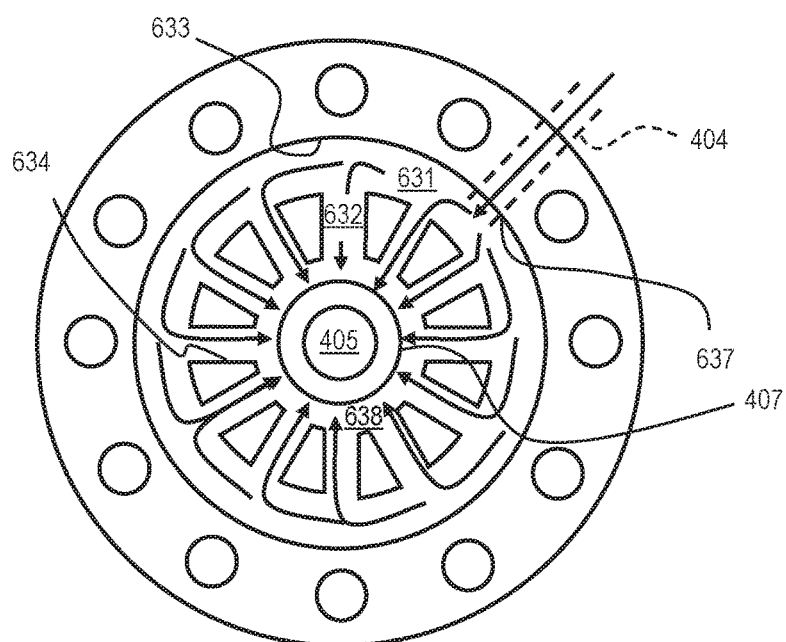
FIG. 6B schematically illustrates a configuration example of a gas lock cover in Embodiment 3.

The present embodiment provides a configuration example of a gas lock device 400 for reducing the fluctuation in droplet trajectory caused by the lock gas flow. FIGS. 6A and 6B schematically illustrate a configuration example of the gas lock cover 410 in the present embodiment. FIG. 6B illustrates a face of a support 403 being opposed to the nozzle. The support 403 is a component of the gas lock cover 410.

The gas lock cover 410 may have a buffer space 430 in the channel 404 for the lock gas. The gas lock cover 410 may include an input-side part 640, a support 403, and a cylinder 401. The support 403 may have a function of a nozzle holder to support the nozzle 660 and fix the nozzle 660 to the tank 61.

The buffer space 430 may be formed in the channel 404 between the input-side part 640 and the support 403. In FIG. 6A, the channel 404 may include the space in the tube 435 and the buffer space 430. The buffer space 430 may include an outer annular space 631 and an inner annular space 638 formed to surround the cylinder internal cavity 405 as seen in the direction of outputting droplets. The centers of the outer annular space 631 and the inner annular space 638 may match the center of the cylinder internal cavity 405 or the designed droplet trajectory 272.

The outer annular space 631 may be a space defined between a plurality of islands 634 disposed in a circle and the outer wall 633. The inner annular space 638 may be a space between the plurality of islands 634 and the droplet entrance 407 of the cylinder 401. Each of the plurality of islands 634 may contact with the nozzle 660 to support the nozzle 660 and in addition, to regulate the flow of the lock gas.

The buffer space 430 may further include a radial space 632 between the outer annular space 631 and the inner annular space 638. The radial space 632 may be formed between each two of multiple islands 634 disposed in a circle. The radial space 632 may connect the outer annular space 631 and the cylinder internal cavity 405 via the inner annular space 638. The inner annular space 638 may be omitted.

The radial space 632 may be configured with a plurality of space pairs; the spaces of each pair are opposed to each other with respect to the center of the cylinder internal cavity 405. The radial space 632 may be composed of spaces having the identical shapes or spaces having different shapes. The radial space 632 may be symmetric about the center of the cylinder internal cavity 405 or the designed droplet trajectory 272.

The cylinder 401 may have an inner wall tapered from the input end. The droplet entrance 407 of the cylinder 401 may be exposed to the buffer space 430. The buffer space 430 may join the cylinder internal cavity 405 via the droplet entrance 407.

The tube 435 may join the outer annular space 631 at the lock gas entrance 637. The lock gas entrance 637 to the outer annular space 631 may face the outer end face of one island 634.

Operation

The lock gas supplied from the gas supply unit 450 may flow through the channel 404 in the tube 435 and enter the buffer space 430 from the lock gas entrance 637. As illustrated in FIGS. 6A and 6B, the buffer space 430 may diffuse the incoming lock gas flow into different directions to guide the gas to the cylinder internal cavity 405. The speed of the lock gas flow may decrease in the buffer space 430.

Specifically, the lock gas that has entered the buffer space 430 through the lock gas entrance 637 may flow in the outer annular space 631 in both circumferential directions. Furthermore, the lock gas may flow through the radial space 632 to reach the droplet entrance 407 of the cylinder 401. The lock gas may enter the cylinder internal cavity 405 from radial directions.

Effects

The outer annular space 631 and the radial space 632 may prevent the lock gas entering from the tube 435 from directly blowing the droplets. Since the outer annular space 631 and the radial space 632 may diffuse the incoming gas flow into different directions to guide the gas into the cylinder internal cavity 405, the lock gas may enter the cylinder internal cavity 405 from many different directions.

The speed of the lock gas flow in each direction may decrease. Furthermore, the lock gas may enter the cylinder internal cavity 405 from the opposite direction. As a result, fluctuation in droplet trajectory may be prevented. The radial space 632 may control the directions of the lock gas to enter the cylinder internal cavity 405 more reliably.

5.4 Embodiment 4: Gas Lock Device with Buffer Space (3)

Figure 7A:
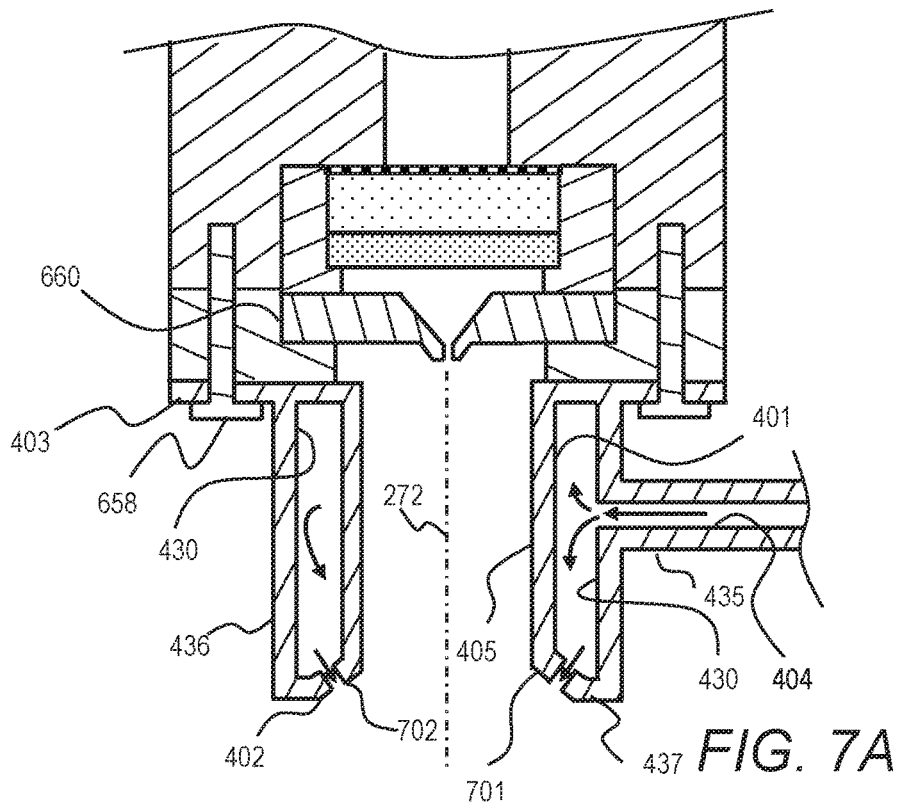
FIG. 7A schematically illustrates a configuration example of a gas lock cover in Embodiment 4.
Figure 7B:
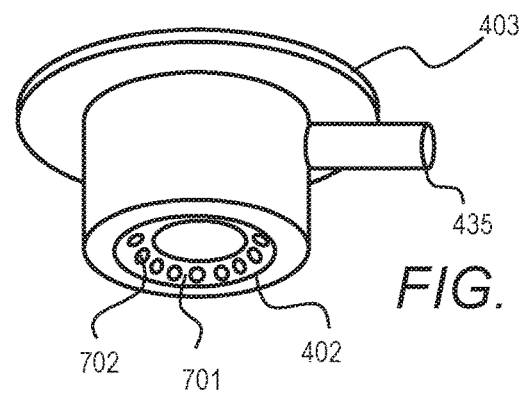
FIG. 7B schematically illustrates a configuration example of a gas lock cover in Embodiment 4.
Figure 7C:
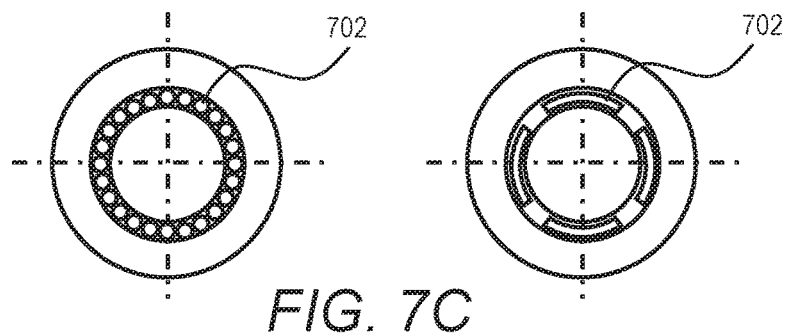
FIG. 7C schematically illustrates a configuration example of a gas lock cover in Embodiment 4.

The present embodiment provides a configuration example of a gas lock device 400 for reducing the fluctuation in droplet trajectory caused by the lock gas flow. Hereinafter, differences from Embodiment 2 are mainly described. FIGS. 7A to 7C schematically illustrate a configuration example of the gas lock cover 410 in the present embodiment. FIG. 7B is a perspective view of the gas lock cover 410 and FIG. 7C provides configuration examples of the output end face of the gas lock cover 410.

The input end of the cylinder 401 may be joined with the support 403. The output end of the cylinder 401 may have a reverse-tapered face 701 that expands outward as the output end gets closer to the plasma generation region 25. The reverse-tapered face 701 may be of the wall of the cylinder internal cavity 405. The reverse-tapered face 701 may have a plurality of lock gas outlets 702.

The plurality of lock gas outlets 702 may be disposed symmetrically about the center of the cylinder 401 or the designed droplet trajectory 272. Each lock gas outlet 702 may be opposed to a lock gas outlet 702.

The number and the shape of the lock gas outlets 702 may depend on the design. For example, the shape of each lock gas outlet 702 may be a circle or an arc slit as illustrated in FIG. 7C. The circular lock gas outlets 702 may have a diameter of 10 to 100 μm, for example.

The lock gas in the buffer space 430 may spout from the lock gas outlet 702. The spouting direction of the lock gas may have a component heading toward the designed droplet trajectory 272 and a component in the output direction of droplets. Each lock gas outlet 702 may be provided with an opposed lock gas outlet 702 to reduce the fluctuation in droplet trajectory caused by the lock gas flow.

5.5 Embodiment 5: Gas Lock Device with Buffer Space (4) (with Damper Member)

Figure 8:
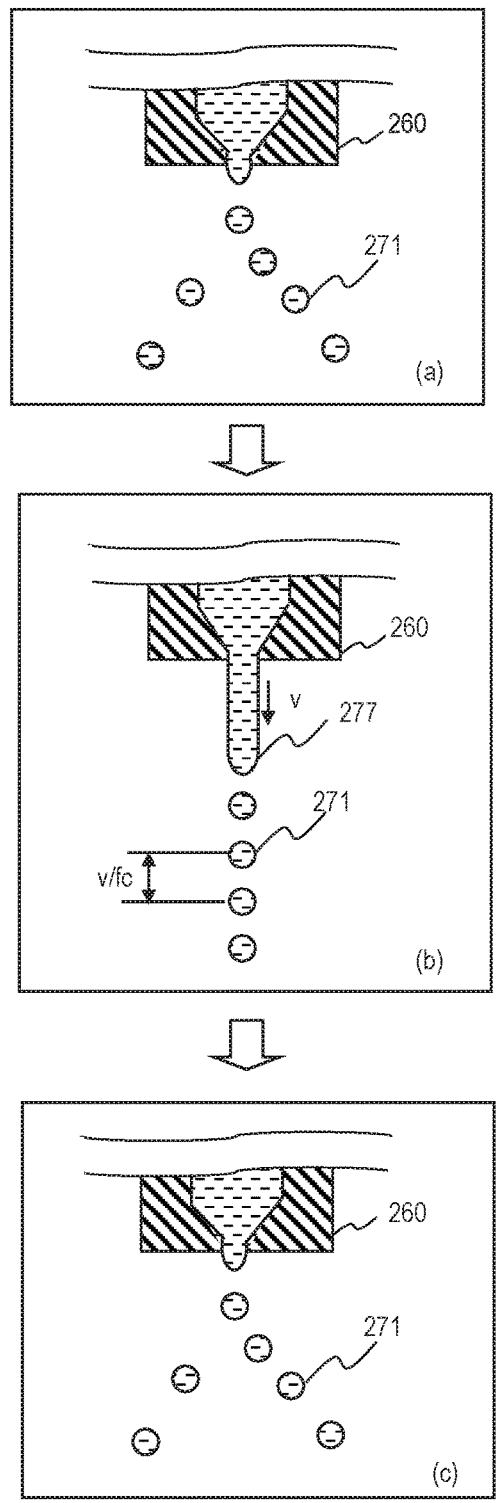
FIG. 8 schematically illustrates states of droplets outputted from a droplet supply device.

FIG. 8 schematically illustrates states of droplets outputted from the droplet supply device 260. FIG. 8(a) schematically illustrates the state of droplets 271 immediately after start of ejection of the droplet material from the droplet supply device 260. FIG. 8(b) schematically illustrates the state when the droplet supply device 260 steadily ejects a jet 277 and droplets 271.

FIG. 8(c) schematically illustrates the state of droplets 271 immediately before stop of ejection of the droplet material from the droplet supply device 260. The operating status of the droplet supply device 260 may change in the order of FIG. 8(a), FIG. 8(b), and FIG. 8(c).

The pressure applied to the droplet material in the tank 61 may be low immediately after the start and immediately before the stop of ejection of the droplet material from the droplet supply device 260. Accordingly, the trajectories of the droplets 271 may become unstable immediately after the start and immediately before the stop of ejection of the droplet material.

When the trajectories of droplets 271 are unstable, the droplets 271 may bounce off the wall forming the buffer space and as a result, may adhere to the nozzle 660. To reduce the momentums of the droplets 271 outputted obliquely with respect to the designed droplet trajectory 272 and to prevent the droplets 271 from adhering to the nozzle 660, the buffer space may be provided with a damper member therein.

Figure 9:
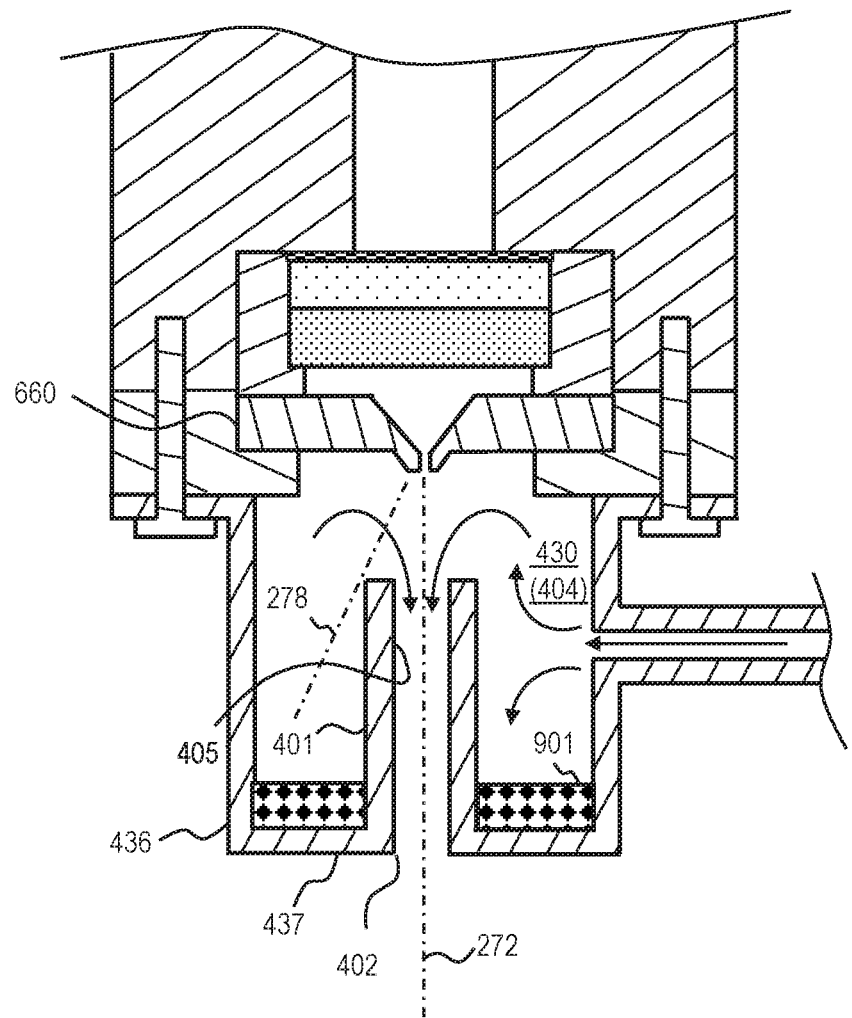
FIG. 9 schematically illustrates a configuration example of a gas lock cover in Embodiment 5.

FIG. 9 schematically illustrates a configuration example of the gas lock cover 410 in the present embodiment. Hereinafter, differences from Embodiment 2 are mainly described. The gas lock cover 410 may have a damper member 901 in the buffer space 430. For example, as illustrated in FIG. 9, the gas lock cover 410 may have a dumper member 901 on the bottom of the buffer space 430. The dumber member 901 may be provided at a different place. The damper member 901 may attenuate the impact of the droplet 271 that hits the damper member 901; the droplet 271 that hits the damper member 901 may adhere to the damper member 901.

The damper member 901 may be formed of a graphite felt made of carbon fiber, for example. The graphite felt includes three-dimensionally tangled carbon fiber in mesh; when a droplet hits the damper member 901, the damper member 901 may absorb the impact. As a result, the damper member 901 may prevent the droplet from bouncing off.

The damper member 901 may be made of a porous ceramic material (inclusive of glass material) or a foam metal. The material of the damper member 901 may be a porous material made of silicon carbide, silicon nitride, aluminum oxide, zirconium oxide, silicon oxide, or a silicon oxide glass including aluminum oxide, or otherwise, a foam metal made of nickel or aluminum. The damper member 901 may be a woven textile of quartz glass fiber.

The walls 436 and 437 defining the buffer space 430 may be heated by the heat conducted from the heater 261 provided for the tank 61. Likewise, the damper member 901 may be heated by the heat conducted from the heater 261. The walls 436 and 437 defining the buffer space 430 may be provided with a heater to heat the damper member 901.

The material of the damper member 901 may be selected from the materials that have contact angles with melted tin being the droplet material is not more than 90°. For example, the material of the damper member 901 may be selected from aluminum, copper, silicon, nickel, titan, and molybdenum.

For example, in the case where the damper member 901 is made of a foam metal of nickel or aluminum, the damper member 901 may melt the droplets adhered thereto and store them in the foam metal. This configuration may prevent deposition of the droplets outputted in a tilted trajectory on the surface of the damper member 901, preventing reduction in impact absorption effect.

5.6 Embodiment 6: Gas Lock Device with Buffer Space (5) (with Tilted Damper Member)

Figure 10:
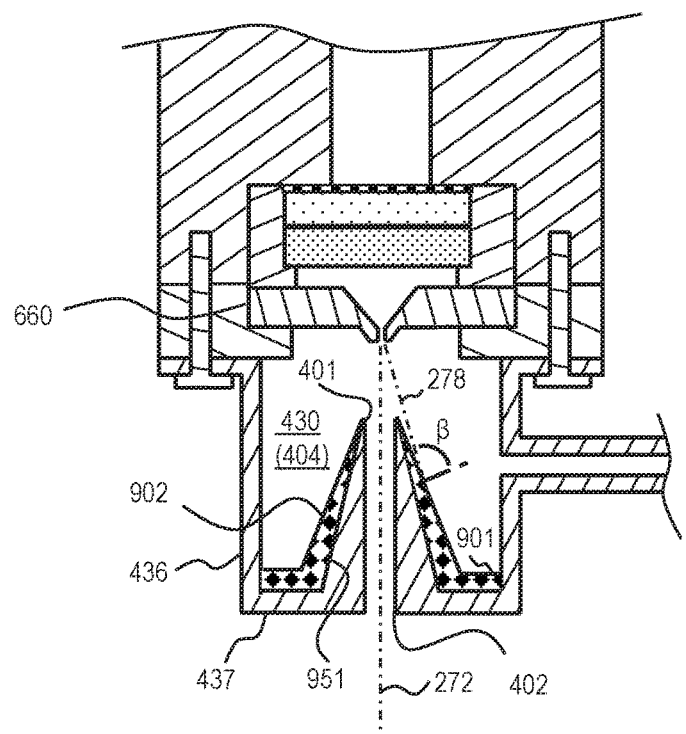
FIG. 10 schematically illustrates a configuration example of a gas lock cover in Embodiment 6.

FIG. 10 schematically illustrates a configuration example of the gas lock cover 410 in the present embodiment.

Hereinafter, differences from Embodiment 5 are mainly described. As illustrated in FIG. 10, the gas lock cover 410 may have a damper member 902 on the outer wall 951 of the cylinder 401. The outer diameter of the cylinder 401 may increase in the output direction. Likewise, the outer diameter of the damper member 902 on the outer wall 951 of the cylinder 401 may increase in the output direction.

Regarding the trajectory 278 of a droplet off the designed droplet trajectory 272, the entry angle β of the droplet to the damper member 902 on the outer wall 951 of the cylinder 401 may be 0° or more; the entry angle β may increase depending on the shape of the damper member 902. A larger entry angle β of a droplet to the damper member 902 may prevent the droplet from bouncing off the damper member 901 toward the nozzle 660.

Figure 11:
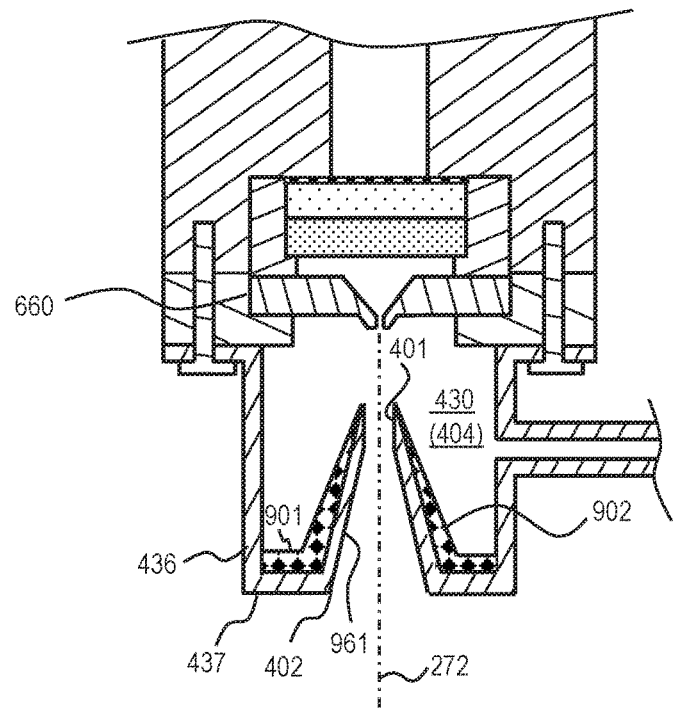
FIG. 11 schematically illustrates a configuration example of a gas lock cover in Embodiment 6.

FIG. 11 schematically illustrates another configuration example of the gas lock cover 410 in the present embodiment. As illustrated in FIG. 11, the diameter of the cylinder internal cavity 405 may increase in the droplet output direction. That is to say, the inner wall 961 of the cylinder 401 may be slanted with respect to the designed droplet trajectory 272 and the distance between the designed droplet trajectory 272 and the inner wall 961 may increase as getting closer to the plasma generation region 25.

When droplets are not outputted normally but outputted slightly obliquely to the designed droplet trajectory 272, the droplets may adhere to the inner wall 906 of the cylinder 401. The adhered droplets may react to $H_2$ to generate $SnH_4$, be deposited onto the cylinder internal cavity 405 heated by the heat conductance, and block the designed droplet trajectory 272.

Increasing the inner diameter of the cylinder 401 on the downstream side may reduce the adhesion of droplets outputted slightly obliquely to the designed droplet trajectory 272 to the inner wall 961 of the cylindrical part. In the configuration of FIG. 11, the damper members 901 and 902 may be omitted. The cylinder 401 may have a uniform outer diameter and an inner diameter increasing on the downstream side.

As set forth above, the present invention has been described with reference to embodiments. The foregoing description is merely provided for the purpose of exemplification but not limitation. Accordingly, it is obvious for a person skilled in the art that the embodiments in this disclosure may be modified within the scope of the appended claims.

A part of the configuration of an embodiment may be replaced with a configuration of another embodiment. A configuration of an embodiment may be incorporated to a configuration of another embodiment. A part of the configuration of each embodiment may be removed, added to a different configuration, or replaced by a different configuration.

The terms used in this specification and the appended claims should be interpreted as "non-limiting". For example, the terms "include" and "be included" should be interpreted as "including the stated elements but not limited to the stated elements". The term "have" should be interpreted as "having the stated elements but not limited to the stated elements". Further, the modifier "one (a/an)" should be interpreted as "at least one" or "one or more."

What is claimed is:

1. A target producing apparatus, to be used in an extreme ultraviolet light generation apparatus capable of generating extreme ultraviolet light by irradiating droplets in a plasma generation region with a laser beam, the target producing apparatus comprising:
a tank capable of containing a melted droplet material;
a nozzle provided at a distal end of the tank and being capable of outputting droplets toward the plasma generation region;
a nozzle holder holding the nozzle on the tank;
a gas supply unit capable of supplying a gas;
a gas lock cover secured to the nozzle holder and provided downstream of the nozzle, the gas lock cover being structured to guide the gas supplied from the gas supply unit,
wherein the gas lock cover includes:
a hollow cylindrical part provided downstream of the nozzle and having an exit opening for outputting droplets that are outputted from the nozzle and pass through an internal cavity of the cylindrical part; and
a channel for transmitting the gas supplied from the gas supply unit, the channel being structured to orient a flow of the transmitted gas so as to flow to the exit opening of the cylindrical part through the internal cavity of the cylindrical part,
wherein the channel includes a buffer space that joins the internal cavity of the cylindrical part and is structured to diffuse the gas flow entering the buffer space into different directions to guide the gas into the internal cavity of the cylindrical part,
wherein the cylindrical part has a reverse-tapered wall expanding outward at an output end, and
wherein the reverse-tapered wall has a plurality of ejection outlets structured to join the buffer space and to eject the gas.

2. A target producing apparatus, to be used in an extreme ultraviolet light generation apparatus capable of generating extreme ultraviolet light by irradiating droplets in a plasma generation region with a laser beam, the target producing apparatus comprising:
a tank capable of containing a melted droplet material;
a nozzle provided at a distal end of the tank and being capable of outputting droplets toward the plasma generation region;
a nozzle holder holding the nozzle on the tank;
a gas supply unit capable of supplying a gas;
a gas lock cover secured to the nozzle holder and provided downstream of the nozzle, the gas lock cover being structured to guide the gas supplied from the gas supply unit,
wherein the gas lock cover includes:
a hollow cylindrical part provided downstream of the nozzle and having an exit opening for outputting droplets that are outputted from the nozzle and pass through an internal cavity of the cylindrical part; and
a channel for transmitting the gas supplied from the gas supply unit, the channel being structured to orient a flow of the transmitted gas so as to flow to the exit opening of the cylindrical part through the internal cavity of the cylindrical part,
wherein the channel includes a buffer space that joins the internal cavity of the cylindrical part and is structured to diffuse the gas flow entering the buffer space into different directions to guide the gas into the internal cavity of the cylindrical part, and
wherein a damper member is provided in the buffer space, the damper member being capable of attenuating impacts of droplets that hit the damper member and catching the droplets that hit the damper member.

3. The target producing apparatus according to claim 2, wherein the damper member is provided on an outer wall of the cylindrical part and an outer diameter of the damper member increases in a direction of outputting the droplets.

* * * * *